(12) United States Patent
Chou

(10) Patent No.: US 6,262,479 B1
(45) Date of Patent: Jul. 17, 2001

(54) SEMICONDUCTOR PACKAGING STRUCTURE

(75) Inventor: Li-Kun Chou, Taipei Hsien (TW)

(73) Assignee: Pan Pacific Semiconductor Co., Ltd., Tao Yuan Hsien (TW)

( * ) Notice: Subject to any disclaimer, the term of this patent is extended or adjusted under 35 U.S.C. 154(b) by 0 days.

(21) Appl. No.: 09/412,427

(22) Filed: Oct. 5, 1999

(51) Int. Cl.⁷ .................................................... H01L 23/12
(52) U.S. Cl. ........................................... 257/704; 257/700
(58) Field of Search .................................. 257/787, 704, 257/700

(56) References Cited

U.S. PATENT DOCUMENTS 4,626,960 * 12/1986 Hamano et al. ..................... 257/704
5,864,092 * 12/1999 Gore et al. ............................ 257/704
5,998,862 * 12/1999 Yamanaka ............................ 257/704
6,011,304 * 1/2000 Mertol ................................... 257/704

* cited by examiner

Primary Examiner—Roy Potter
(74) Attorney, Agent, or Firm—Rosenberg, Klein & Lee

(57) ABSTRACT

A semiconductor packaging structure for packaging a semiconductor element comprises: a flat substrate having a chip seat and having a plurality of outer lead wires for electrically connecting the packaging element and the liner. A wall is formed by molding compound and is installed at periphery of the substrate in order to prevent the problem of mold flush in packaging. Bonding wires are connected on the element for electrically connecting the packaging element with outer circuits. The liner extending inwards and outwards than the wall with a predetermined distance to prevent that a mold flush problem will induce in the wall. Therefore, in the present invention, a wall is formed by molding compound for reducing cost and increasing the flexibility in utility.

5 Claims, 3 Drawing Sheets

SEMICONDUCTOR PACKAGING STRUCTURE

FIELD OF THE INVENTION

The present invention relates to a semiconductor packaging structure, and especially to an improvement structure of a semiconductor package structure wherein a wall is formed on the substrate by molding compound.

BACKGROUND OF THE INVENTION

Recently, packaging is more and more important in microelectronic industry. The performance of package is an important factor to the effect of the other components. The factors in packaging comprise size, weight, cost, number of pins, power suffered, and the latency between chips. Thus, a preferred packaging must consider the factors of material, construction, and electric property in order to achieve the requirement of a specification by a minimum cost and to have a better reliability.

As shown in FIG. 1, a general semiconductor package structure with groove, for example, a packaging structure used in CCD or other photoelectric elements, is illustrated. As shown in the figure, this semiconductor package structure serves to package a photoelectric element and includes a substrate for bearing such photoelectric element, bonding wires for electrically connecting components to the substrate, a transparent cover or potting resin covered thereon for protecting packaging element.

As shown in FIG. 1, the substrate 100 has a groove in the middle portion thereof and a wall is formed on the periphery thereof. Traces are arranged on the substrate so that the semiconductor element packaged therein may be electrically connected to the outer circuit by bonding wires.

In general, substrates used in semiconductor package can be formed by ceramic material in order to have a preferred hermetic, or formed of industrial plastic materials, such as BT, through molding. However, ceramics are expensive, and are difficult to be finished. While substrates formed by general BT or other plastic materials with groove are difficult in developing a mold. This is not preferred for electronic industry or photoelectric industry which are developed quickly.

SUMMARY OF THE INVENTION

Therefore, the object of the present invention is to provide a semiconductor structure with a simple structural mold and a lower cost.

Therefore, the present invention provide a semiconductor packaging structure for packaging a semiconductor element comprises: a flat substrate having a chip seat and having a plurality of outer lead wires for electrically connecting the packaging element with the liner. A wall is formed by molding compound and is installed at periphery of the substrate in order to prevent the problem of mold flush in packaging. Bonding wires are connected on the element for electrically connecting the packaging element with outer devices. The liner extends inwards and outwards than the wall with a predetermined distance to prevent that a mold flush problem will induce in the wall. Therefore, in the present invention, a wall is formed by molding compound for reducing cost and increasing the flexibility in utility.

The various objects and advantages of the present invention will be more readily understood from the following detailed description when read in conjunction with the appended drawing.

DETAILED DESCRIPTION OF THE PREFERRED EMBODIMENTS

Referring to FIGS. 3 to 6, the semiconductor packaging structure of the present invention is illustrated. In this embodiment, the semiconductor packaging structure serves to package an photoelectric element, for example, a charge coupling device (CCD), and includes a substrate 200 made of such as epoxy resins ((for example, BT, FR3x, FR4xx, FR5xx, etc)) or ceramic materials. A wall portion 240 is installed on the substrate for forming a groove to receive a photoelectric element.

Figure 3:
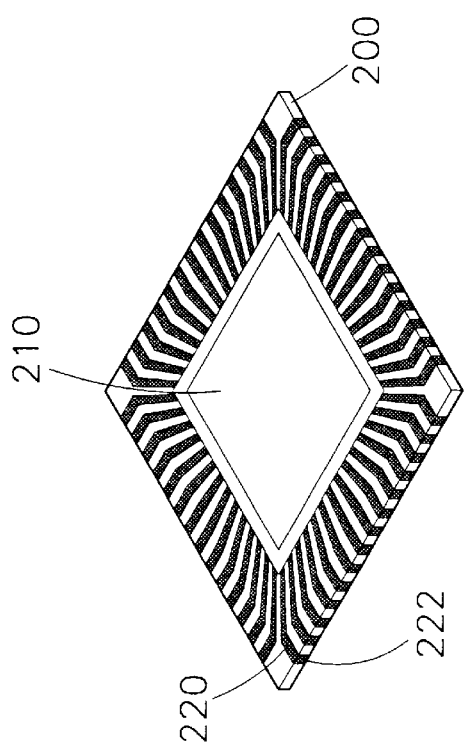
FIG. 3 is a schematic view showing the substrate in the semiconductor package structure in the first embodiment in the present invention.

With reference to FIG. 3, a perspective view of the substrate 200 and the related elements are illustrated. A chip seat 210 is installed on the substrate 200. A plurality of outer lead wires 220 and metal wires 222 are installed on the periphery of the chip seat 210. The metal wire 222 extends to pass through the lateral side of the substrate 200 to the bottom of the substrate 200.

Figure 2:
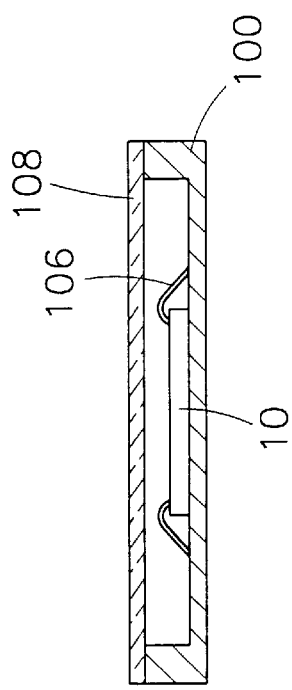
FIG. 2 is a cross sectional view showing a prior art semiconductor package structure.
Figure 1:
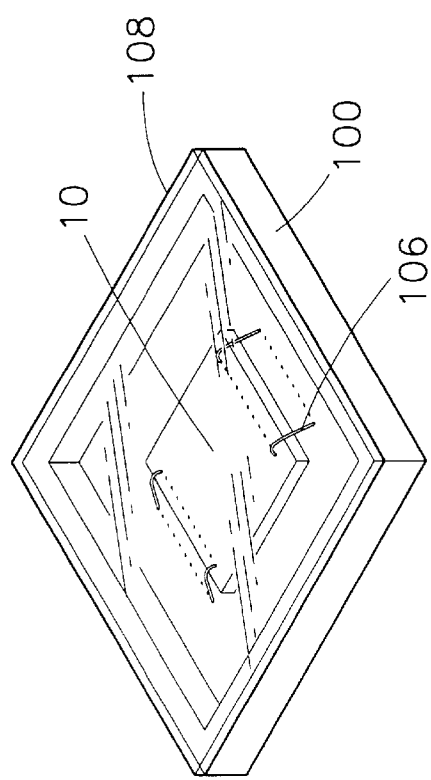
FIG. 1 is a schematic view showing a prior art semiconductor package structure.
Figure 4:
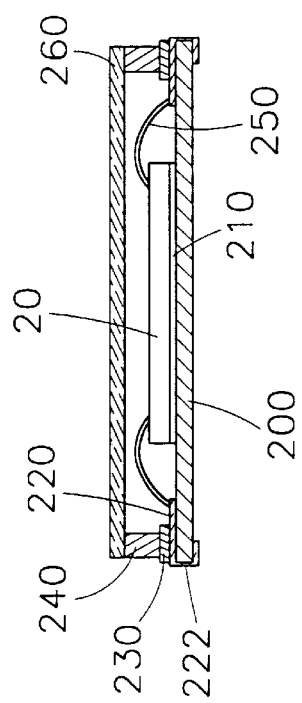
FIG. 4 is a lateral view showing the substrate in the semiconductor package structure in the first embodiment of the present invention.

With reference to FIG. 4, a cross sectional view of the semiconductor packaging structure according to the present invention is illustrated. A wall 240 is installed on the substrate 200. The wall 240 is formed by molding compound and is installed at the periphery of the substrate 200. Since the outer lead wires 220 will form with an undulated surface. Thus, a liner (for example, insulating plate) is firstly coated on the periphery of the substrate 200 of the wall 240 for forming a flat seat to install the wall 240 and increase adhesion. Referring to FIG. 4, the liner 230 is extended inwards than the wall with a preset distance in order to prevent that a mold flush problem will induce in the wall 240. The bonding wire 250 is bonded, and a transparent upper cover 20 is added thereon. Therefore, the packaging structure is complete.

Figure 5:
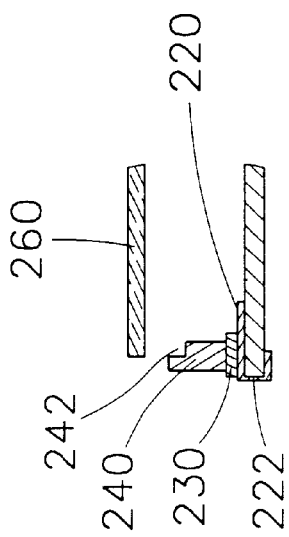
FIG. 5 is a partial cross sectional view showing another embodiment of the present invention.

Moreover, with reference to FIG. 5, a partial cross sectional view of another embodiment according to the present invention is illustrated. As shown in the figure, a mouth 242 is installed in the inner side of the wall 240.

Figure 6:
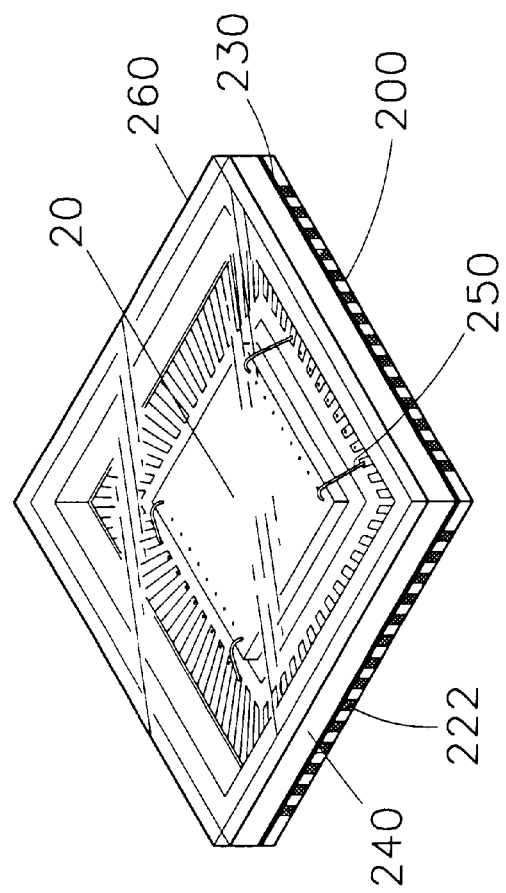
FIG. 6 is a perspective view showing the substrate in the semiconductor package structure in the first embodiment of the present invention.

With reference to FIG. 6, a perspective view of the first embodiment of the present invention is illustrated. It is appreciated from this figure that in the semiconductor packaging structure of the present invention, the metal wires 222 extends through the lateral side of the substrate 200 to the bottom of the substrate 200. Therefore, even this element is arranged on the circuit board, some electric joints will expose outwards so that the user may check the structure easily. Moreover, the transparent upper cover can be replaced by a potting resin for increasing the elasticity of the manufacturing process.

It can be appreciated that in the present invention, since the wall 230 has a simple shape and can be shaped by molding compound. Thus the metal wires 222 extends through the lateral side of the substrate 200 to the bottom of the substrate 200 so that the user may check the structure easily. In the package, a liner 230 is installed for increasing the adhesion of the wall 230 to prevent that a mold flush problem will induce in the wall 240. A mouth 242 is installed at inner side of the wall 240 for indicating the transparent upper cover 260. Moreover, potting resin or transparent upper cover may serve to package this element to increase the flexibility of manufacturing.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A semiconductor packaging structure for packaging a semiconductor element comprising:

a flat substrate having a chip seat formed thereon and having a plurality of outer lead wires contiguous a top surface of said flat substrate and extending to a bottom surface of said flat substrate;

a wall formed of a molding compound and positioned along a periphery of said flat substrate, said wall having a lateral wall thickness;

a liner positioned between said wall and said plurality of outer lead wires, said liner having a lateral liner thickness greater than said lateral wall thickness; and, a plurality of bonding wires electrically connecting said semiconductor element to said plurality of outer lead wires.

2. The semiconductor packaging structure as recited in claim 1 wherein a transparent upper cover is mounted on said wall.

3. The semiconductor packaging structure as recited in claim 1 wherein a potting resin is adhered to said semiconductor element.

4. The semiconductor packaging structure as recited in claim 1 wherein said liner is formed of an electrically insulating material.

5. The semiconductor packaging structure as recited in claim 2 wherein a mouth groove is formed on an inner side of said wall for receiving said transparent upper cover.

* * * * *

(12) EX PARTE REEXAMINATION CERTIFICATE (5313th)

United States Patent
Chou

(10) Number: US 6,262,479 C1
(45) Certificate Issued: Mar. 28, 2006

(54) SEMICONDUCTOR PACKAGING STRUCTURE

(75) Inventor: Li-Kun Chou, Taipei Hsien (TW)

(73) Assignee: Pan Pacific Semiconductor Co., Ltd., Tao Yuan Hsien (TW)

Reexamination Request:
No. 90/006,716, Jul. 17, 2003

Reexamination Certificate for:
Patent No.: 6,262,479
Issued: Jul. 17, 2001
Appl. No.: 09/412,427
Filed: Oct. 5, 1999

(51) Int. Cl.
*H01L 23/12* (2006.01)

(52) U.S. Cl. .................................. 257/704; 257/700
(58) Field of Classification Search ............. 257/434, 257/700, 704; 438/116
See application file for complete search history.

(56) References Cited

U.S. PATENT DOCUMENTS

| | | | | |
|---|---|---|---|---|
| 3,622,419 A | * | 11/1971 | London et al. | 438/64 |
| 4,626,960 A | | 12/1986 | Hamano et al. | 361/388 |
| 4,681,656 A | | 7/1987 | Byrum | 156/645 |
| 5,293,511 A | * | 3/1994 | Poradish et al. | 257/434 |
| 5,311,007 A | | 5/1994 | Kato | 250/208 |
| 5,336,931 A | | 8/1994 | Juskey et al. | 257/787 |
| 5,458,716 A | | 10/1995 | Alfaro et al. | 156/245 |
| 5,572,067 A | * | 11/1996 | Thalapaneni | 257/669 |
| 5,744,752 A | * | 4/1998 | McHerron et al. | 174/52.4 |
| 5,818,401 A | | 10/1998 | Wang | 345/31 |
| 5,864,092 A | | 1/1999 | Gore et al. | 174/52.4 |
| 5,998,862 A | | 12/1999 | Yamanaka | 257/704 |
| 6,011,304 A | | 1/2000 | Mertol | 257/706 |
| 6,028,351 A | * | 2/2000 | Klonis et al. | 257/680 |
| 6,443,761 B1 | | 9/2002 | Robinson et al. | 439/517 |

* cited by examiner

*Primary Examiner*—Maria Guerrero

(57) ABSTRACT

A semiconductor packaging structure for packaging a semiconductor element comprises: a flat substrate having a chip seat and having a plurality of outer lead wires for electrically connecting the packaging element and the liner. A wall is formed by molding compound and is installed at periphery of the substrate in order to prevent the problem of mold flush in packaging. Bonding wires are connected on the element for electrically connecting the packaging element with outer circuits. The liner extending inwards and outwards than the wall with a predetermined distance to prevent that a mold flush problem will induce in the wall. Therefore, in the present invention, a wall is formed by molding compound for reducing cost and increasing the flexibility in utility.

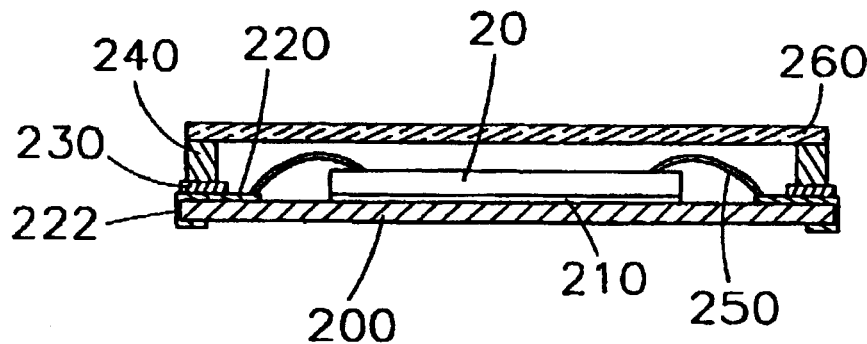

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–5 are cancelled.

* * * * *